US009799791B2

(12) United States Patent
Collins

(10) Patent No.: US 9,799,791 B2
(45) Date of Patent: Oct. 24, 2017

(54) PROCESS FOR MANUFACTURING A PHOTONIC CIRCUIT WITH ACTIVE AND PASSIVE STRUCTURES

(71) Applicant: Huawei Technologies Co., Ltd., Shenzhen (CN)

(72) Inventor: Tom Collins, Sint-Denijs (BE)

(73) Assignee: Huawei Technologies Co., Ltd., Shenzhen (CN)

( * ) Notice: Subject to any disclaimer, the term of this patent is extended or adjusted under 35 U.S.C. 154(b) by 297 days.

(21) Appl. No.: 14/595,663

(22) Filed: Jan. 13, 2015

(65) Prior Publication Data
US 2015/0140720 A1 May 21, 2015

Related U.S. Application Data

(63) Continuation of application No. PCT/EP2013/055158, filed on Mar. 13, 2013.

(30) Foreign Application Priority Data

Jul. 13, 2012 (EP) .................................... 12176431

(51) Int. Cl.
*H01L 21/00* (2006.01)
*H01L 31/18* (2006.01)
(Continued)

(52) U.S. Cl.
CPC ............ *H01L 31/1804* (2013.01); *G02B 6/13* (2013.01); *G02B 6/132* (2013.01); *G02B 6/136* (2013.01);
(Continued)

(58) Field of Classification Search
CPC ............... H01L 31/1804; H01L 27/144; H01L 31/02327; G02B 6/13; G02B 6/132; G02B 6/136
(Continued)

(56) References Cited

U.S. PATENT DOCUMENTS 6,901,194 B2 * 5/2005 Charlton ................ B82Y 20/00
    385/11
7,515,793 B2 * 4/2009 Dehlinger .......... G02B 6/12004
    385/129
(Continued)

FOREIGN PATENT DOCUMENTS

DE    102009013112 A1    9/2010
EP       2214042 A1    8/2010
(Continued)

OTHER PUBLICATIONS

Partial English Translation and Abstract of Japanese Patent Application No. JPA2006522465, Apr. 8, 2016, 32 pages.
Partial English Translation and Abstract of Japanese Patent Application No. JPA2007052328, Apr. 11, 2016, 41 pages.
(Continued)

*Primary Examiner* — Tod T Van Roy
*Assistant Examiner* — Vu A Vu
(74) *Attorney, Agent, or Firm* — Conley Rose, P.C.

(57) ABSTRACT

A process for manufacturing a photonic circuit comprises: manufacturing on a first wafer a first layer stack comprising an underclad oxide layer and a high refractive index waveguide layer; patterning the high refractive index waveguide layer to generate a passive photonic structures; planarizing the first layer stack with a planarizing oxide layer having a thickness below 300 nanometers above the high refractive index waveguide layer; annealing the patterned high refractive index waveguide layer before and/or after the planarizing oxide layer; manufacturing on a second wafer a second layer stack comprising a detachable mono-crystalline silicon waveguide layer; transferring and bonding the first layer stack and the second layer stack; manufacturing active photonic devices in the mono-crystalline silicon waveguide layer; and realizing evanescent coupling between the mono-crystalline silicon waveguide layer and the high refractive index waveguide layer.

19 Claims, 2 Drawing Sheets

(51) Int. Cl.
  *G02B 6/13*  (2006.01)
  *G02B 6/132*  (2006.01)
  *G02B 6/136*  (2006.01)
  *H01L 27/144*  (2006.01)
  *H01L 31/0232*  (2014.01)

(52) U.S. Cl.
  CPC ...... *H01L 27/144* (2013.01); *H01L 31/02327* (2013.01)

(58) Field of Classification Search
  USPC .......................................................... 438/65
  See application file for complete search history.

(56) References Cited

U.S. PATENT DOCUMENTS

| | | | | |
|---|---|---|---|---|
| 7,863,650 | B2* | 1/2011 | Letertre | H01L 21/02381 257/189 |
| 8,111,729 | B2* | 2/2012 | Sysak | B82Y 20/00 372/50.121 |
| 2002/0181822 | A1* | 12/2002 | Doerr | G02F 1/225 385/3 |
| 2003/0056718 | A1* | 3/2003 | Kawahara | C30B 25/18 117/84 |
| 2005/0053319 | A1 | 3/2005 | Doan | |
| 2006/0189102 | A1 | 8/2006 | Barge et al. | |
| 2009/0016399 | A1 | 1/2009 | Bowers | |
| 2011/0073989 | A1 | 3/2011 | Rong et al. | |
| 2012/0091551 | A1 | 4/2012 | Marenco | |
| 2013/0113064 | A1 | 5/2013 | Okamoto et al. | |

FOREIGN PATENT DOCUMENTS

| | | | |
|---|---|---|---|
| JP | 2006522465 | A | 9/2006 |
| JP | 20070052328 | A | 3/2007 |
| JP | 2009503614 | A | 1/2009 |
| JP | 2012104839 | A | 5/2012 |
| WO | 0065393 | A1 | 11/2000 |
| WO | 2004088723 | A2 | 10/2004 |
| WO | 2007016070 | A2 | 2/2007 |
| WO | 2012008272 | A1 | 1/2012 |

OTHER PUBLICATIONS

Partial English Translation and Abstract of Japanese Patent Application No. JPA2012104839, Apr. 11, 2016, 43 pages.
Foreign Communication From a Counterpart Application, Japanese Application No. 22015-520854, Japanese Office Action dated Jan. 5, 2016, 4 pages.
Foreign Communication From a Counterpart Application, Japanese Application No. 22015-520854, English Translation of Japanese Office Action dated Jan. 5, 2016, 5 pages.
Biberman, A., et al., "CMOS-Compatible Scalable Photonic Switch Architecture Using 3D-Integrated Deposited Silicon Materials for High-Performance Data Center Networks," OSA/OFC/NFOEC, 2011, 3 pages.
Doerr, C. R., et al., "Eight-Channel SiO2/Si3N4/Si/Ge CWDM Receiver," IEEE Photonics Technology Letters, vol. 23, No. 17, Sep. 1, 2011, pp. 1201-1203.
Tsuchizawa, T., et al., "Monolithic Integration of Silicon-, Germanium-, and Silica-Based Optical Devices for Telecommunications Applications," IEEE Journal of Selected Topics in Quantum Electronics, vol. 17, No. 3, May/Jun. 2011, pp. 516-525.
Bauters, J., et al., "Planar waveguides with less than 0.1 dB/m propagation loss fabricated with wafer bonding," vol. 19, No. 24, Optics Express, Nov. 21, 2011, 12 pages.
Foreign Communication From a Counterpart Application, PCT Application No. PCT/EP2013/055158, International Search Report dated Apr. 9, 2013, 5 pages.
Foreign Communication From a Counterpart Application, PCT Application No. PCT/EP2013/055158, Written Opinion dated Apr. 9, 2013, 4 pages.
Partial English Translation and Abstract of Japanese Patent Application No. JPA2009503614, Oct. 12, 2016, 18 pages.
Foreign Communication From a Counterpart Application, Japanese Application No. JP2015520854, Japanese Office Action dated Sep. 20, 2016, 3 pages.
Foreign Communication From a Counterpart Application, Japanese Application No. JP2015520854, English Translation of Japanese Office Action dated Sep. 20, 2016, 3 pages.
Foreign Communication From a Counterpart Application, European Application No. 12176431.0, European Office Action dated Nov. 4, 2016, 4 pages.

* cited by examiner

PROCESS FOR MANUFACTURING A PHOTONIC CIRCUIT WITH ACTIVE AND PASSIVE STRUCTURES

CROSS-REFERENCE TO RELATED APPLICATION

This application is a continuation of International Application No. PCT/EP2013/055158, filed on Mar. 13, 2013, which claims priority to European Patent Application No. 12176431.0, filed on Jul. 13, 2012, both of which are hereby incorporated by reference in their entireties.

FIELD OF THE INVENTION

The present invention generally relates to photonic integrated circuits (PICs) that are used for instance in telecommunication, data communication, sensors, and biomedical applications. Such PICs typically have to integrate active photonic devices, e.g. optical modulators and detectors, and high quality passive photonic structures like optical splitters, waveguides and gratings. The invention more particularly concerns a process and platform that enable integrating high performing active and passive photonic structures.

BACKGROUND

Silicon (Si) based photonics have the potential to offer large savings in photonic integrated circuits by leveraging the economies of scale using cost-efficient technology with equipment that is readily available in complementary metal-oxide semiconductor (CMOS) foundries. In addition, the high refractive index contrast achievable with silicon confines light more efficiently and allows tighter bends thereby making photonic integrated circuits much smaller. Most optical functions (except a light source) can be fabricated using silicon. In particular, the performance of integrated germanium detectors and silicon modulators is very encouraging. Improved integration and complex PICs are potentially possible.

Today's problem with silicon based photonics is that the performance of passive functions in silicon, e.g. an arrayed waveguide grating (AWG) or splitter, is insufficient. This limits the usefulness of the technology for complex PICs integrating active and passive functions.

A solution offering a high quality silicon nitride (SiN) platform is described in the article entitled "Planar Waveguides with less than 0.1 dB/m propagation loss fabricated with wafer bonding" from the authors J. F. Bauters et al., published in Optics Express, Vol. 19, No. 24, on 21 Nov. 2011.

Application of platforms offering high quality silicon nitride (SiN) waveguides like the one reported by Bauters et al., is limited since it is hard to envisage how active photonic devices like detectors and modulators can be fabricated in a silicon nitride-only platform.

Alternatively, several papers demonstrate PICs using silicon-only waveguides. As already indicated above, a silicon-only platform however can only offer passive devices like an AWG or splitter with limited performance.

Thirdly, various solutions combining silicon waveguides for active devices with silicon nitride waveguides for passive structures have been proposed in literature. The following paragraphs briefly discuss some of them.

In the article "Eight-Channel $SiO_2/Si_3N_4/Si/Ge$ CWDM Receiver" from the authors C. R. Doerr et al., published on 1 Sep. 2011 in IEEE Photonics Technology Letters, Vol. 23, No. 17, pages 1201-1203, a silicon nitride layer is deposited though plasma-enhanced chemical vapor deposition (PECVD) after the active silicon photonics devices have been fabricated.

In the platform known from Doerr et al., the choice to fabricate the silicon nitride layer after the silicon photonic active devices have been fabricated severely limits the available thermal budget. This is why the deposition technique chosen for the silicon nitride layer is PECVD. Unfortunately, PECVD based silicon nitride has several problems. Firstly the hydrogen content is relatively high which increases optical losses especially around 1530 nanometer which is in the telecom wavelength range. Also the thickness and refractive index uniformity is far worse than for example with low-pressure chemical vapor deposition (LP-CVD) based silicon nitride. LPCVD however typically requires temperatures above 780 degrees Celsius (° C.) which would damage the silicon photonic active devices.

The article "Monolithic Integration of Silicon-, Germanium-, and Silica-Based Optical Devices for Telecommunications Applications" from the authors T. Tsuchizawa et al., published in IEEE Journal of Selected Topics in Quantum Electronics, Vol. 17, No. 3, May/June 2011, describes deposition at low temperature of a silicon rich oxide layer after the silicon photonic active devices have been fabricated.

In the process and platform known from T. Tsuchizawa et al., a low temperature electron-cyclotron resonance chemical vapor deposition (ECR-CVD) process is used. The reported propagation loss stays above 1.5 decibels (dB)/centimeter (cm), and uniformity of the layer is not disclosed.

In the article "CMOS-Compatible Scalable Photonic Switch Architecture Using 3D-Integrated Deposited Silicon Materials for High-Performance Data Center Networks" published in Optical Fiber Communication Conference and Exposition and the National Fiber Optic Engineers Conference (OFC/NFOEC), 19-23 Sep. 2010, the authors A. Biberman et al. calculate the performance of a switch using a high quality silicon nitride layer and an amorphous silicon layer.

Although Biberman et al. propose to use a high quality low loss silicon nitride layer, the silicon layer proposed is not mono-crystalline but deposited as amorphous or poly-crystalline silicon by LPCVD techniques. It is therefore not possible to use this layer to fabricate integrated germanium detectors—a key component for PICs—in this layer.

International patent application publication 00/65393 from Centre National de la Recherche Scientifique, entitled "Photonic Integrated Circuit Comprising a Resonant Optical Component and Methods for Making Same" illustrates in FIG. 6 and the corresponding paragraphs an embodiment wherein a first wafer receives an $SiO_2$ underclad layer (8) and Si waveguide layer (16). Through wafer bonding, a $Si_3N_4$ layer (20) is transferred. The layers 16 and 20 are vertically coupled through evanescent coupling. Although it also seems to be an objective of International patent application publication 00/65393 to separate the manufacturing of active and passive components, the passive structures are manufactured in the silicon waveguide layer (16) whereas active structures (laser) are manufactured in the silicon nitride layer. As already indicated here above, the performance of such silicon based passive structures is insufficient.

United States Patent Application Publication 2009/0016399 entitled "Hybrid Silicon Evanescent Photodetectors" discloses in FIG. 8 and the corresponding paragraphs [0055]-[0059] a photodetector that is obtained by bonding a second wafer with a Group III-V structure onto a first wafer with silicon-on-insulator (SOI) structure. The SOI wafer contains a passive waveguide.

The teaching of United States Patent Application Publication 2009/0016399 is not applicable for manufacturing high quality photonic devices integrating active and passive structures for several reasons. Firstly, United States Patent Application Publication 2009/0016399 suggests to manufacture passive structures in the silicon waveguide layer on the first layer. The performance of such silicon based passive structures is insufficient for photonic circuits integrating active and passive photonic functions. Further, the III-V wafers are only available in much smaller wafer sizes than silicon. Bonding III-V wafers onto silicon wafers consequently results in high waste. Once bonded, the III-V wafer and SOI wafer cannot be processed anymore through processes that are compatible with CMOS wafer fabrication. The technology required to perform the processing after bonding in United States Patent Application Publication 2009/0016399 consequently is not expected to be readily available in CMOS foundries as a result of which the processing becomes more complex and expensive.

It is an objective of the present invention to disclose a process for manufacturing a photonic circuit integrating active and passive photonic functions that overcomes the above mentioned drawbacks of existing solutions. More particularly, it is an objective to disclose such a process that enables integrating high performing passive optical structures with active optical devices in a platform that can be manufactured using technology available in CMOS foundries without a risk for damaging the active photonic devices.

SUMMARY

According to the present invention, the above defined objectives are realized by a process for manufacturing a photonic circuit as defined by claim 1, the process comprising: manufacturing a first layer stack on a first wafer, the first layer stack comprising an underclad oxide layer and a high refractive index waveguide layer, i.e. a waveguide layer with refractive index above 1.8; patterning the high refractive index waveguide layer to thereby generate a patterned high refractive index waveguide layer containing passive photonic structures; planarizing the first layer stack on the first wafer with a planarizing oxide layer having a thickness below 300 nanometers above the high refractive index waveguide layer; annealing the patterned high refractive index waveguide layer before and/or after the planarizing oxide layer to thereby generate an annealed and patterned high refractive index waveguide layer (103") and planarizing oxide layer (104); manufacturing a second layer stack on a second wafer, the second layer stack comprising a detachable, mono-crystalline silicon waveguide layer; transferring the second wafer with second layer stack onto the first wafer with first layer stack and bonding the first layer stack and the second layer stack; removing the substrate of the second wafer; manufacturing active photonic devices in the mono-crystalline silicon waveguide layer to thereby generate a mono-crystalline silicon waveguide layer with active photonic devices; and realizing evanescent coupling between the mono-crystalline silicon waveguide layer with active photonic devices and the annealed and patterned high refractive index waveguide layer.

Thus, the invention resides in using wafer bonding techniques to transfer a detachable, mono-crystalline silicon waveguide layer that forms part of a second wafer onto a first wafer wherein a high refractive index waveguide layer has been fabricated, patterned and planarized. The detachable, mono-crystalline silicon waveguide layer will enable to fabricate active photonic devices like detectors and modulators. The high refractive index waveguide layer enables to fabricate high performing passive structures, like AWGs and splitters. The total oxide thickness between the high refractive index waveguide layer and the detachable, mono-crystalline silicon waveguide layer must stay below 300 nanometers (nm) and preferably even below 200 nm to facilitate evanescent coupling of light between the two light guiding mediums. The mono-crystalline silicon waveguide layer can be made detachable in various ways. One possibility is to use a silicon dioxide layer between the mono-crystalline silicon layer and the silicon substrate of the second wafer. Alternatively, the silicon substrate of the second wafer can be subjected to a high energy implant to create a damage layer at a predefined depth. This way, the mono-crystalline silicon waveguide layer on top of the damage region can be readily detached from the second wafer and transferred to another wafer.

The process according to the invention offers high quality waveguides, high performing passive photonic structures and state of the art active photonic devices like integrated waveguide detectors and high speed modulators. The high refractive index waveguide layer can be prepared, covered in oxide and planarized with no restrictions to thermal budget. The high temperature anneals needed for the passive structures can be completed before any temperature sensitive devices are fabricated. Then the detachable, mono-crystalline silicon layer is transferred through wafer bonding techniques. After bonding and removing the second wafer's substrate, active photonic devices are manufactured in the mono-crystalline silicon layer in the traditional way as the buried high refractive index waveguide layer with patterned passive structures can withstand any temperature or processing normally associated with making the active devices. Finally, any subsequent processing required for the photonic integrated circuit, like providing the interconnects, etc., are completed.

It is noticed that U.S. Pat. No. 7,807,482 discloses in FIG. 4 and the corresponding section in column 9, lines 5-17 an embodiment wherein an amorphous silicon layer (21) is transferred through wafer bonding onto a silicon nitride layer (28). Although the transfer of the silicon layer onto the silicon nitride layer shows some resemblance with the transfer of the high refractive index waveguide layer, possibly a silicon nitride layer, onto the mono-crystalline silicon layer in the process according to the present invention, the problem tackled in U.S. Pat. No. 7,807,482 is to facilitate surface topology, rather than integrating highly performing active and passive structures in a PIC. In U.S. Pat. No. 7,807,482, the layers 21 and 28 are not optically coupled, and the silicon layer 21 is amorphous, which are essential differences.

In a preferred embodiment of the process for manufacturing a photonic circuit according to the present invention, defined by claim 2, the high refractive index waveguide layer has a refractive index between 1.8 and 2.5.

Indeed, silicon with refractive index of 3.4 and other materials with refractive index above 2.5 may be excluded as material for the high refractive index waveguide layer since the performance of passive structures manufactured in such materials is insufficient.

In a further preferred embodiment of the process for manufacturing a photonic circuit according to the present invention, the high refractive index waveguide layer is made of silicon nitride or silicon oxynitride or silicon carbide or tantalum pentoxide or tellurium dioxide.

Indeed, although the preferred embodiment uses SiN as material for the high refractive index waveguide layer, application of the present invention is not limited to usage of a particular material for the high refractive index waveguide layer, as long as its refractive index is above 1.8 and preferably below 2.5. Other materials, for instance silicon oxynitride, silicon carbide, tantalum pentoxide ($Ta_2O_5$) or tellurium dioxide ($TeO_2$), may also serve as material for the high refractive index waveguide layer. The above list of materials for the high refractive index waveguide layer however is not exhaustive as will be understood by a person skilled in the art.

In yet another preferred embodiment of the process for manufacturing a photonic circuit according to the present invention, defined by claim 4, the high refractive index waveguide layer is a silicon nitride layer manufactured through Low Pressure Chemical Vapor Deposition or LPCVD.

Indeed, in a preferred embodiment of the invention, the high quality waveguide layer is stoichiometric silicon nitride. In this embodiment, SiN is deposited through LPCVD and subsequently annealed to drive out hydrogen to improve optical losses around 1520 nm and to reduce stress in the layer. Low Pressure Chemical Vapour Deposition or LPCVD is a high temperature process that takes place at temperatures above 750° C. (when used to deposit silicon nitride). To achieve excellent refractive index control stoichiometric, silicon nitride is chosen. Unfortunately, the deposited film exhibits high stress, typically above 1 GigaPascal (GPa), making it difficult to deposit films above 300 nanometers thick. One option is to make the silicon nitride film "silicon rich" to reduce the stress but typically the control of refractive index becomes much worse. Next, the waveguide layer will be patterned to create the passive structures and properly planarized. Stress in the stoichiometric silicon nitride layer is further reduced using high temperature anneals before and/or after the layer is patterned and planarized. These anneals take place at temperatures above 1000° C. The annealing is preferably done at a temperature between 1150° C. and 1200° C. to drive out hydrogen and to reduce stress in the silicon nitride layer. This way, a high quality, uniform layer with a thickness exceeding 200 nanometer can be deposited using an LPCVD process without cracks.

It is noticed that variations to the deposition of the silicon nitride layer include deposition in multiple steps which may include processes between the deposition steps to reduce stress, e.g. anneals.

In a preferred embodiment of the process for manufacturing a photonic circuit according to the present invention, defined by claim 5, the second wafer is made of a group IV material.

Indeed, when using a group IV material, e.g. silicon or germanium, the second wafer can be manufactured using technology that is compatible with CMOS processing. Such technology is readily available in CMOS foundries and consequently reduces the complexity for rapidly mass-manufacturing photonic circuits in accordance with the principles of the present invention. An additional advantage of the use of group IV materials for the second wafer is that the first and second wafer become available in the same, large wafer sizes. This will substantially reduce waste in comparison to for instance United States patent application publication 2009/0016399, already cited above, wherein a second wafer with III-V structure that is only available in smaller sizes than silicon wafers is bonded onto the first wafer with integrated passive waveguide layer.

According to a further aspect of the invention, as defined by claim 6, the mono-crystalline silicon waveguide layer is manufactured using the SOITEC SMARTCUT technique or the mono-crystalline silicon waveguide layer is manufactured on top of an implant induced damage layer in the second wafer.

Indeed, the mono-crystalline silicon waveguide layer with a silicon dioxide layer between it and the silicon substrate can be fabricated using the SOITEC SMARTCUT technique. Alternatively, part of the SOITEC SMARTCUT technique may be used to prepare a silicon wafer with a detachable, mono-crystalline silicon waveguide layer on top of it without in-between silicon dioxide. In the latter approach, a high energy implant in the silicon wafer creates a damage region at a predefined depth as a result of which the mono-crystalline silicon waveguide layer becomes detachable from the silicon wafer. In the preferred embodiment, to facilitate wafer bonding a thin silicon dioxide layer is then deposited or grown on the mono-crystalline silicon waveguide layer prior to wafer bonding.

In a preferred embodiment of the process for manufacturing a photonic circuit according to the present invention, defined by claim 7, the first layer stack on the first wafer is planarized with a planarizing oxide layer having a thickness below 200 nanometers directly above the high refractive index waveguide layer.

Indeed, the total oxide thickness between the high refractive index waveguide layer and the mono-crystalline silicon waveguide layer preferably is less than 200 nanometer for improved evanescent coupling of light between the two guiding mediums.

Optionally, as defined by claim 8, the underclad oxide layer in the process according to the present invention is manufactured by thermal growth or deposition of a silicon dioxide layer with a thickness of at least 1.5 micron of a material with refractive index below 1.5.

Hence, a layer with a thickness of at least 1.5 micron of an oxide with refractive index below 1.5 preferably serves as underclad layer for the combined waveguide layers. This way, the amount of light lost to the substrate of the photonic circuit is minimized. Such underclad layer, typically manufactured in silicon dioxide, can be deposited using Chemical Vapor Deposition or CVD equipment readily available in CMOS facilities or by thermal oxidation of silicon.

In addition to a process for manufacturing a photonic circuit as defined by claim 1, the present invention also relates to a corresponding photonic circuit as defined by claim 9.

DETAILED DESCRIPTION OF EMBODIMENT(S)

FIG. 1A-1D illustrate the manufacturing a first wafer with a first layer stack consisting of an $SiO_2$ underclad layer 102, a patterned and annealed SiN waveguide layer 103", and an $SiO_2$ planarizing layer 104.

Figure 1A:
FIG. 1A-1D illustrate the steps of preparing a first wafer in an embodiment of the process according to the present invention.

FIG. 1A shows the result of a first and second step in the processing of the first wafer. This first wafer is processed in order to contain a high quality, waveguide. In the first step illustrated by FIG. 1A, a thick oxide layer 102 of at least 1.5 micron is grown or deposited on a silicon (Si) substrate 101. The thick $SiO_2$ layer 102 will serve as underclad layer to minimize the amount of light lost to the substrate 101. The underclad layer 102 can be deposited using Chemical Vapor Deposition (CVD) or thermally grown. Thereafter, the first wafer receives a high quality silicon nitride or SiN layer 103, deposited via a high temperature Low Pressure Chemical Vapor Deposition or LPCVD process. This LPCVD process will typically take place at temperatures above 750° C. and deposit for instance a 400 nanometer thick silicon nitride layer 103. This thickness may be deposited in one step or multiple steps. The SiN layer 103 will have to be patterned and annealed, as will be explained further below. Optionally, before the patterning takes place, a sequence of anneals may further improve the quality and stoichiometry of the SiN waveguide layer 103". Such anneals take place at temperatures above 1000° C., preferably at temperatures between 1150° C. and 1200° C. As a result, a high quality, uniform SiN layer 103 is obtained for fabricating highly performing waveguides and passive photonic structures with minimum propagation losses.

Figure 1B:
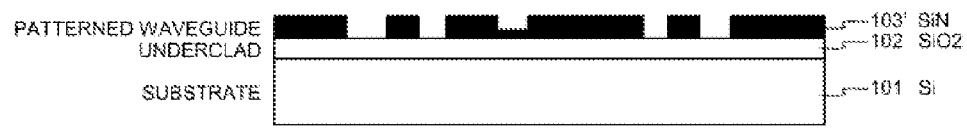

FIG. 1B shows the result of the second step in the processing of the first wafer. The silicon nitride layer 103 is patterned via one or more masking steps depending on the number of different etch depths required. This results in a patterned SiN waveguide layer 103' comprising passive photonic structures like optical splitters and gratings.

Figure 1C:

In an optional third step of the processing of the first wafer, illustrated by FIG. 1C, a sequence of anneals improves the quality and stoichiometry of the patterned SiN waveguide layer 103'. The high temperature annealing alters the SiN waveguide layer 103' to further reduce optical loss and reduce stress. The patterned and annealed SiN waveguide layer is referenced 103" in FIG. 1C.

Figure 1D:

FIG. 1D shows the result of the fourth step in processing the first wafer. In this fourth step, the first wafer is covered with silicon dioxide 104 or $SiO_2$ through a Chemical Vapor Deposition or CVD process. Chemical/mechanical polishing of the $SiO_2$ layer 104 allows to planarize the patterned first wafer. The planarizing $SiO_2$ layer 104 has a thickness above the SiN waveguide of below 200 nanometers and preferably even below 100 nanometers to allow evanescent coupling between the SiN waveguide layer 103" and a second waveguide layer that will be transferred and bonded onto the first layer stack. Optionally, an anneal step is added to improve the quality and stoichiometry of the patterned SiN waveguide layer 103. Annealing in other words may take place before planarizing, or it may take place after planarizing, or it may take place before and after planarizing.

Figure 2:
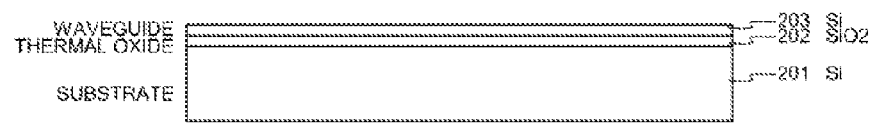
FIG. 2 illustrates the steps of preparing a second wafer in an embodiment of the process according to the present invention.

FIG. 2 illustrates manufacturing a second wafer with second layer stack consisting of a thermal $SiO_2$ layer 202 and a mono-crystalline Si waveguide layer 203. For example, the mono-crystalline silicon waveguide layer 203 with a silicon dioxide layer $SiO_2$ 202 between it and the silicon substrate 201 may be fabricated using the SOITEC SMARTCUT technique.

Alternatively, a bare silicon wafer can be subjected to a high energy implant to create a damage layer at a predefined depth. This way, the mono-crystalline silicon waveguide layer 203 on top of the damage region can be readily detached from the original wafer and transferred to another wafer (SOITEC SMARTCUT technique).

It is noticed that in order to improve wafer bonding, a thin silicon dioxide layer may be grown or deposited on the mono-crystalline Si waveguide layer 203. The silicon dioxide layer for instance may have a thickness below 100 nanometers and serves to facilitate bonding. The deposition of such thin silicon dioxide layer is not essential as wafer bonding is possible between silicon and silicon dioxide. However, a wafer bond process of silicon dioxide to silicon dioxide may be preferred as this has proven to offer the highest yields.

Other wafer bonding techniques are equally valid as long as the distance between the silicon nitride waveguide layer and the mono-crystalline silicon waveguide layer are compatible with evanescent coupling.

Figure 3A:
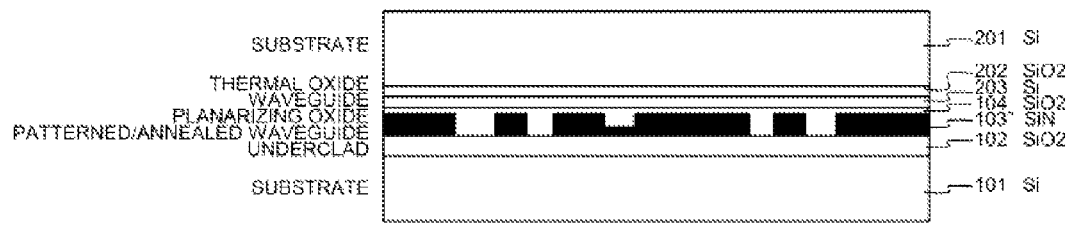
FIG. 3A-3B illustrate the steps of bonding the first wafer and the second wafer in an embodiment of the process according to the present invention.
Figure 3B:
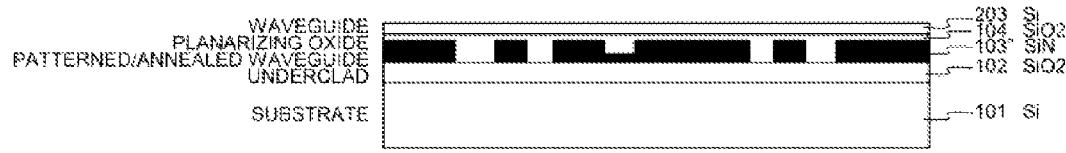

FIG. 3A-3B illustrate bonding of the processed first and second wafers. Thereto, the processed second wafer 201 with layers 202 and 203 is inverted and transferred onto the first processed wafer 101 with layers 101, 102, 103" and 104. Then, wafer bonding of the first and second wafers is realized.

In the following step of the manufacturing process, illustrated by FIG. 3B, the back side or substrate 201 and the thermal oxide layer 202 of the second wafer are removed through a back grind process and mechanical/chemical etch process.

If a silicon wafer with implant induced damage layer is used as described above, the detachment technique is as per the SOITEC SMARTCUT technique. Following detachment of the bulk of the silicon, a well-controlled etch step is then required to remove the damaged silicon layer.

Figure 4:
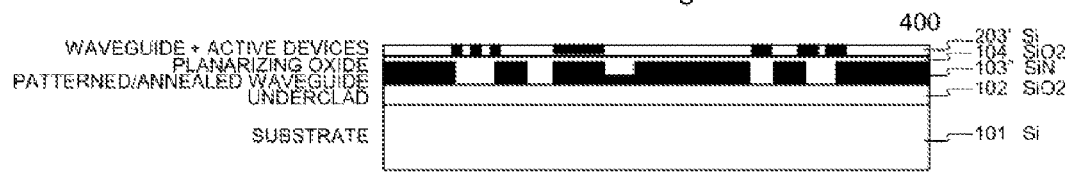
FIG. 4 illustrates a photonic integrated circuit manufactured through an embodiment of the process according to the present invention.

After bonding, active photonic devices like for instance optical detectors or modulators are manufactured in the mono-crystalline silicon layer. The mono-crystalline silicon layer with integrated active devices is referenced 203' in FIG. 4. The active devices can be manufactured in the traditional way as the buried high refractive index waveguide layer with patterned passive structures 103" can withstand any temperature or processing normally associated with making the active devices.

At last, the SiN waveguide layer with passive photonic structures 103" and the mono-crystalline Si waveguide layer 203' are optically coupled through evanescent coupling. Thereto, the in-between silicon oxide 104 preferably is less than 100 nanometer thick for improved coupling of light between the two guiding mediums.

Finally, not illustrated by any of the figures, additional top oxide cladding and/or interconnects can be added to complete the photonic integrated circuit.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

What is claimed is:

1. A process for manufacturing a photonic circuit comprising:
    manufacturing a first layer stack on a first wafer, wherein the first layer stack comprises an underclad oxide layer and a high refractive index waveguide layer, wherein the high refractive index waveguide layer has a refractive index above 1.8, and wherein the underclad oxide layer is disposed above a first substrate and below the high refractive index waveguide layer;
    patterning the high refractive index waveguide layer to generate a patterned high refractive index waveguide layer comprising passive photonic structures;
    planarizing the first layer stack on the first wafer with a planarizing oxide layer above the high refractive index waveguide layer, wherein the planarizing oxide layer has a thickness below 300 nanometer;
    annealing the patterned high refractive index waveguide layer to generate an annealed and patterned high refractive index waveguide layer and the planarizing oxide layer;
    manufacturing a second layer stack on a second wafer, wherein the second layer stack comprises a detachable mono-crystalline silicon waveguide layer;
    transferring the second wafer with the second layer stack onto the first wafer with the first layer stack;
    bonding the first layer stack and the second layer stack;
    removing a second substrate of the second wafer;
    manufacturing active photonic devices in the mono-crystalline silicon waveguide layer to generate a mono-crystalline silicon waveguide layer with active photonic devices; and
    realizing evanescent coupling between the mono-crystalline silicon waveguide layer with the active photonic devices and the annealed and patterned high refractive index waveguide layer.

2. The process for manufacturing a photonic circuit according to claim 1, wherein the high refractive index waveguide layer has the refractive index between 1.8 and 2.5.

3. The process for manufacturing a photonic circuit according to claim 2, wherein the high refractive index waveguide layer is made of at least one of silicon nitride, silicon oxynitride, tantalium pentoxide, and tellurium dioxide.

4. The process for manufacturing a photonic circuit according to claim 1, wherein the high refractive index waveguide layer is a silicon nitride layer manufactured through Low Pressure Chemical Vapor Deposition (LP-CVD).

5. The process for manufacturing a photonic circuit according to claim 1, wherein the second wafer is made of a group IV material.

6. The process for manufacturing a photonic circuit according to claim 1, wherein the mono-crystalline silicon waveguide layer is manufactured using a smartcut technique.

7. The process for manufacturing a photonic circuit according to claim 1, wherein the mono-crystalline silicon waveguide layer is manufactured on top of an implant induced damage layer in the second wafer.

8. The process for manufacturing a photonic circuit according to claim 1, wherein the first layer stack on the first wafer is planarized with the planarizing oxide layer directly above the high refractive index waveguide layer, and wherein the planarizing oxide layer has a thickness below 200 nanometers.

9. The process for manufacturing a photonic circuit according to claim 1, wherein the underclad oxide layer is manufactured by thermal growth of a material with a refractive index below 1.5 with a thickness of at least 1.5 micron.

10. The process for manufacturing a photonic circuit according to claim 1, wherein the underclad oxide layer is manufactured by deposition of a material with a refractive index below 1.5 with a thickness of at least 1.5 micron.

11. A photonic circuit manufactured through a process comprising:
    manufacturing a first layer stack on a first wafer, wherein the first layer stack comprises an underclad oxide layer and a high refractive index waveguide layer, wherein the high refractive index waveguide layer has a refractive index above 1.8, and wherein the underclad oxide layer is disposed above a first substrate and below the high refractive index waveguide layer;
    patterning the high refractive index waveguide layer to generate a patterned high refractive index waveguide layer comprising passive photonic structures;
    planarizing the first layer stack on the first wafer with a planarizing oxide layer above the high refractive index waveguide layer, wherein the planarizing oxide layer has a thickness below 300 nanometers;
    annealing the patterned high refractive index waveguide layer before or after planarizing the first layer stack, thereby generating an annealed and patterned high refractive index waveguide layer and the planarizing oxide layer;
    manufacturing a second layer stack on a second wafer, wherein the second layer stack comprises a detachable mono-crystalline silicon waveguide layer;
    transferring the second wafer with the second layer stack onto the first wafer with the first layer stack;
    bonding the first layer stack and the second layer stack;
    removing a second substrate of the second wafer;
    manufacturing active photonic devices in the mono-crystalline silicon waveguide layer to generate a mono-crystalline silicon waveguide layer with active photonic devices; and
    realizing evanescent coupling between the mono-crystalline silicon waveguide layer with the active photonic devices and the annealed and patterned high refractive index waveguide layer.

12. A process for manufacturing a photonic circuit comprising:
    manufacturing a first layer stack on a first wafer, wherein the first layer stack comprises an underclad oxide layer and a high refractive index waveguide layer, wherein the high refractive index waveguide layer has a refractive index above 1.8, and wherein the underclad oxide layer is disposed above a first substrate and below the high refractive index waveguide layer;

patterning the high refractive index waveguide layer to generate a patterned high refractive index waveguide layer comprising passive photonic structures;

planarizing the first layer stack on the first wafer with a planarizing oxide layer above the high refractive index waveguide layer, wherein the planarizing oxide layer has a thickness below 300 nanometers;

annealing the patterned high refractive index waveguide layer to generate an annealed and patterned high refractive index waveguide layer and the planarizing oxide layer;

manufacturing a second layer stack on a second wafer, wherein the second layer stack comprises a detachable mono-crystalline silicon waveguide layer, and wherein the second wafer comprises a Group IV material;

transferring the second wafer with the second layer stack onto the first wafer with the first layer stack;

bonding the first layer stack and the second layer stack;

removing a second substrate of the second wafer;

manufacturing active photonic devices in the mono-crystalline silicon waveguide layer to generate a mono-crystalline silicon waveguide layer with active photonic devices; and realizing evanescent coupling between the mono-crystalline silicon waveguide layer with the active photonic devices and the annealed and patterned high refractive index waveguide layer.

13. The process for manufacturing a photonic circuit according to claim 12, wherein the high refractive index waveguide layer has the refractive index between 1.8 and 2.5.

14. The process for manufacturing a photonic circuit according to claim 13, wherein the high refractive index waveguide layer is made of at least one of silicon nitride, silicon oxynitride, tantalum pentoxide, or tellurium dioxide.

15. The process for manufacturing a photonic circuit according to claim 12, wherein the high refractive index waveguide layer is a silicon nitride layer manufactured through Low Pressure Chemical Vapor Deposition (LPCVD).

16. The process for manufacturing a photonic circuit according to claim 12, wherein the mono-crystalline silicon waveguide layer is manufactured using a smartcut technique.

17. The process for manufacturing a photonic circuit according to claim 12, wherein the mono-crystalline silicon waveguide layer is manufactured on top of an implant induced damage layer in the second wafer.

18. The process for manufacturing a photonic circuit according to claim 12, wherein the first layer stack on the first wafer is planarized with the planarizing oxide layer directly above the high refractive index waveguide layer, and wherein the planarizing oxide layer has a thickness below 200 nanometers.

19. The process for manufacturing a photonic circuit according to claim 12, wherein the underclad oxide layer is manufactured by at least one of thermal growth and deposition of a silicon dioxide layer with a thickness of at least 1.5 micron.

* * * * *